United States Patent
Sanzone et al.

(10) Patent No.: US 9,431,105 B2
(45) Date of Patent: Aug. 30, 2016

(54) METHOD AND APPARATUS FOR MEMORY ACCESS MANAGEMENT

(71) Applicant: Cavium, Inc., San Jose, CA (US)

(72) Inventors: Robert A. Sanzone, Hudson, MA (US); Wilson P. Snyder, II, Holliston, MA (US)

(73) Assignee: Cavium, Inc., San Jose, CA (US)

( * ) Notice: Subject to any disclaimer, the term of this patent is extended or adjusted under 35 U.S.C. 154(b) by 260 days.

(21) Appl. No.: 14/191,163

(22) Filed: Feb. 26, 2014

(65) Prior Publication Data

US 2015/0243357 A1 Aug. 27, 2015

(51) Int. Cl.
*G06F 13/16* (2006.01)
*G11C 15/00* (2006.01)

(52) U.S. Cl.
CPC ............ *G11C 15/00* (2013.01); *G06F 13/1657* (2013.01)

(58) Field of Classification Search
CPC .... G11C 15/00; G06F 13/1657; G06F 13/16
See application file for complete search history.

(56) References Cited

U.S. PATENT DOCUMENTS

| | | | | |
|---|---|---|---|---|
| 8,176,259 B2* | 5/2012 | Van Doren | ......... | G06F 12/0828 710/120 |
| 8,239,871 B2* | 8/2012 | Ogasawara | ........... | G06F 9/4825 714/38.12 |
| 8,468,308 B2* | 6/2013 | Steely, Jr. | ........... | G06F 12/0831 711/145 |
| 8,595,401 B2 | 11/2013 | Sanzone et al. | | |
| 8,615,629 B2* | 12/2013 | Sukonik | .................. | G06F 13/18 711/117 |
| 8,650,364 B2* | 2/2014 | Zhang | ................. | G06F 12/0862 711/137 |
| 2005/0160235 A1* | 7/2005 | Steely, Jr. | ........... | G06F 12/0831 711/144 |
| 2006/0059316 A1 | 3/2006 | Asher et al. | | |
| 2009/0300320 A1* | 12/2009 | Zhang | ................. | G06F 12/0862 711/213 |

OTHER PUBLICATIONS

Webopedia, "Virtual Memory", Nov. 20, 2007, pp. 1-2, http://web.archive.org/web/20071130014141/http://www.webopedia.com/TERM/v/virtual_memory.html.*
Kostas Pagiamtzis, "Content-Addressable Memory Introduction", Feb. 8, 2012, pp. 1-5, http://web.archive.org/web/20120208091302/http://www.pagiamtzis.com/cam/camintro/.*
Webopedia, "Queue", Aug. 10, 2002, pp. 1-2, https://web.archive.org/web/20020810034508/http://www.webopedia.com/TERM/Q/queue.html.*
Kostas Pagiamtzis, "Content-Addressable Memory (CAM) Circuits and Architectures: A Tutorial and Survey", Feb. 8, 2012, pp. 1-7, http://web.archive.org/web/20120208091307/http://www.pagiamtzis.com/pubs/jssc2006-abstract/.*
Webopedia, "Virtual", Aug. 8, 2002, pp. 1-2, https://web.archive.org/web/20020808062436/http://www.webopedia.com/TERM/V/virtual.html.*

(Continued)

*Primary Examiner* — Christopher D Birkhimer
(74) *Attorney, Agent, or Firm* — Hamilton, Brook, Smith & Reynolds, P.C.

(57) ABSTRACT

In an embodiment, a method for managing access to memory includes receiving requests for access to a memory from one or more devices, each particular request associated with one of a plurality of virtual channels. A tag is assigned to each request received. Each tag assigned is added to a linked list associated with the corresponding virtual channel. Each request received with the assigned tag is transmitted to the memory. Responses to the requests are received from the memory, each response having an associated tag, and the responses received are sent to the one or more devices based on the corresponding linked list and the corresponding tag.

9 Claims, 4 Drawing Sheets

(56) References Cited

OTHER PUBLICATIONS

Net Indistries, "Physical Computer Memory and Virtual Memory", May 27, 2007, pp. 1-2, http://web.archive.org/web/20070527132110/http://science.jrank.org/pages/1698/Computer-Memory-Physical-Virtual-Memory.html.*

Tutorialspoint, "Operating System—Virtual Memory", Mar. 24, 2013, pp. 1-5, http://web.archive.org/web/20130324012557/http://www.tutorialspoint.com/operating_system/os_virtual_memory.htm.*

Matt Welsh, "Lecture 15: Virtual Memory", Oct. 22, 2009, pp. 1-39, http://www.eecs.harvard.edu/~mdw/course/cs61/mediawiki/images/0/0b/Lectures-virtmem.pdf.*

* cited by examiner

METHOD AND APPARATUS FOR MEMORY ACCESS MANAGEMENT

BACKGROUND

Processors that provide an interface for memory access for multiple requestors may have their performance restricted by a large number of requestors, bandwidth requirements of the requestors, latency requirements of the requestors, and physical limitations on the chip. Limited bandwidth among the requestors can hinder the performance of the processor.

SUMMARY

According to at least one example embodiment, a method and corresponding apparatus for managing access to memory include receiving requests for access to a memory from one or more devices, each particular request associated with one of a plurality of virtual channels; assigning a tag to each request received; adding each tag assigned to a linked list associated with the corresponding virtual channel; transmitting each request received with the assigned tag to the memory; receiving responses to the requests from the memory, each response having an associated tag; and transmitting the responses received to the one or more devices based on the corresponding linked list and the corresponding tag.

Each request received may include a virtual channel identifier. Adding each tag assigned to the linked list associated with the corresponding virtual channel may include accessing a content addressable memory (CAM) with the virtual channel identifier of the request received to determine which linked list to add the tag.

The tag assigned to a particular request may be retired upon transmitting the corresponding response.

Transmitting the responses received may include comparing the tags of the responses received with a top of lists state indicating which tags are at the top of the corresponding linked lists and transmitting those responses received for which the comparison indicates a match. The top of lists state may be updated to replace the tags corresponding to responses transmitted with tags corresponding to the next entry in the corresponding linked lists.

Requests received may be transmitted to the memory in order of receipt.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Figure 1:
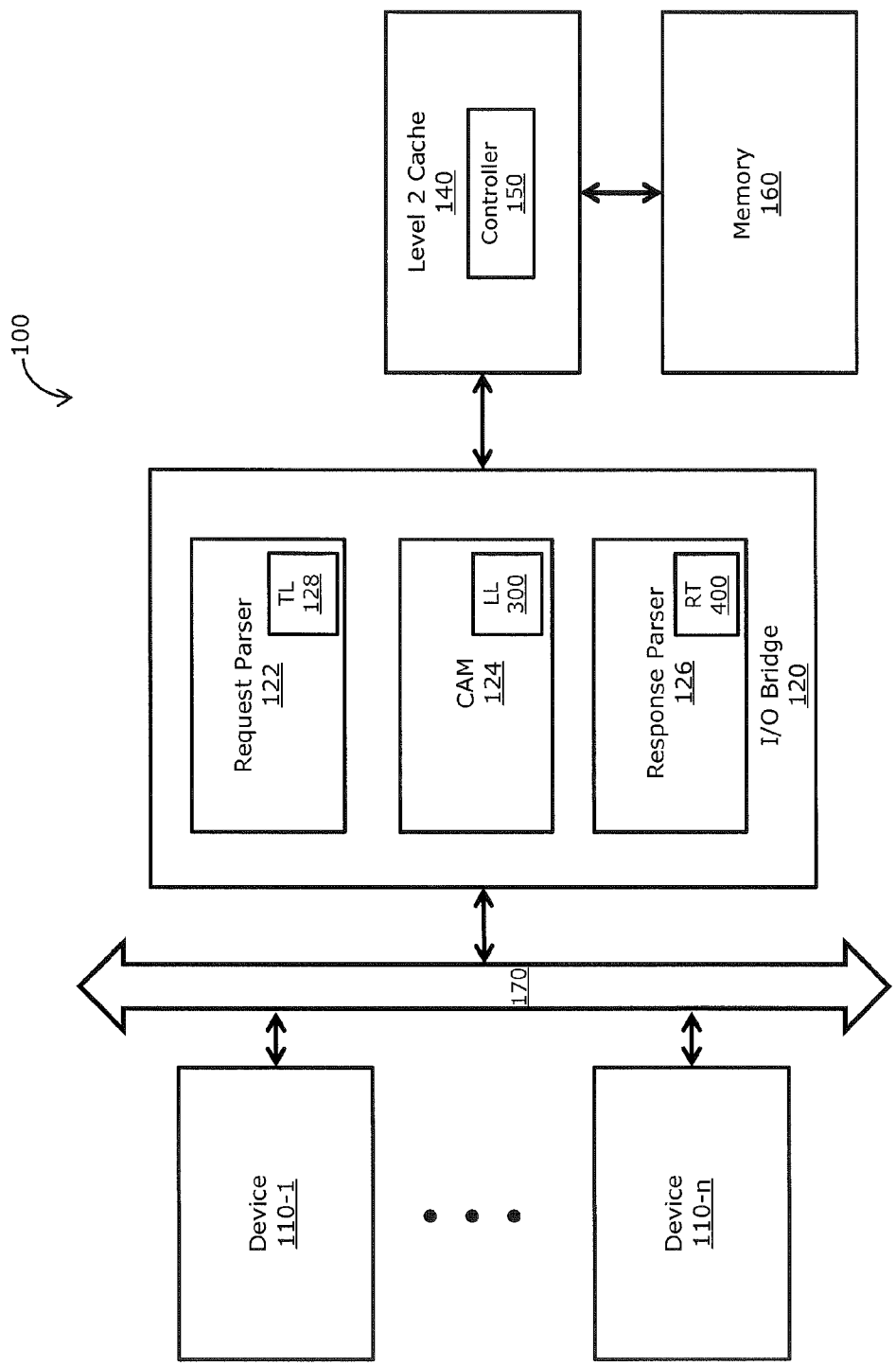
FIG. 1 is a block diagram of apparatus illustrating memory access, according to at least one example embodiment.

FIG. 1 is a block diagram of apparatus illustrating memory access, according to at least one example embodiment. The apparatus, which may be embodied in a processor, such as a network processor unit (NPU), a custom application-specific integrated circuit (ASIC), an OCTEON® processor available from Cavium, Inc., or the like, includes multiple devices, such as co-processors and I/O devices, 110-1 to 110-$n$ ("110"), an I/O bridge unit 120, a level-two data cache (L2C) 140, and a memory component 160. The multiple devices 110 are coupled to the I/O bridge unit 120 via I/O bus 170. The memory component 160 is accessible by the multiple devices 110 for read and write requests through the I/O bridge unit 120. The L2C 140 includes a controller 150 for controlling access to the memory 160.

The bridge unit 120 includes a request parser 122, a content addressable memory (CAM) 124, and a response parser 126. The request parser 122 handles read and write requests received from the devices 110 and maintains a list of free tags 128 for assignment to the requests. The CAM 124 is responsible for maintaining a linked-list table structure 300. The response parser is responsible for managing the transmission of responses received from the L2C 140 to the devices in order from a response table structure 400, based on the linked list table structure 300.

The multiple devices 110 can make read or write requests to the memory-subsystem or L2C 140. These requests pass through the bridge unit 120 on the way to the L2C 140. Requests contain a virtual channel identifier (VCI) which identifies it as belonging to a virtual channel such that all requests with the same VCI belong to the same virtual channel. Each device 110 can originate multiple virtual channels. For each request presented to the L2C 140, the L2C may send a response to be returned to the particular device that sent the request. Write operations may or may not have a response returned, depending on information included in the request. Devices require responses from the L2C 140 to be returned in the same order per VCI as the requests were sent to the L2C by the corresponding device. However, the L2C 140 may return responses to the bridge unit 120 independent of the order in which it receives the requests.

In order to return the responses to the devices in order, the bridge unit 120 contains state indicating the order the transactions were presented to the L2C 140 so that it can re-order the responses per VCI before sending them on to the devices. In an example embodiment, the number N of devices 110 may be, e.g., $N=2^8$ with the number M of virtual channels per device $M=2^4$. Thus, the total number of VCIs can be of any value of $2^{12}$ possible values. Therefore, a manageable method is needed to keep track of the virtual channel flows.

Figure 2:
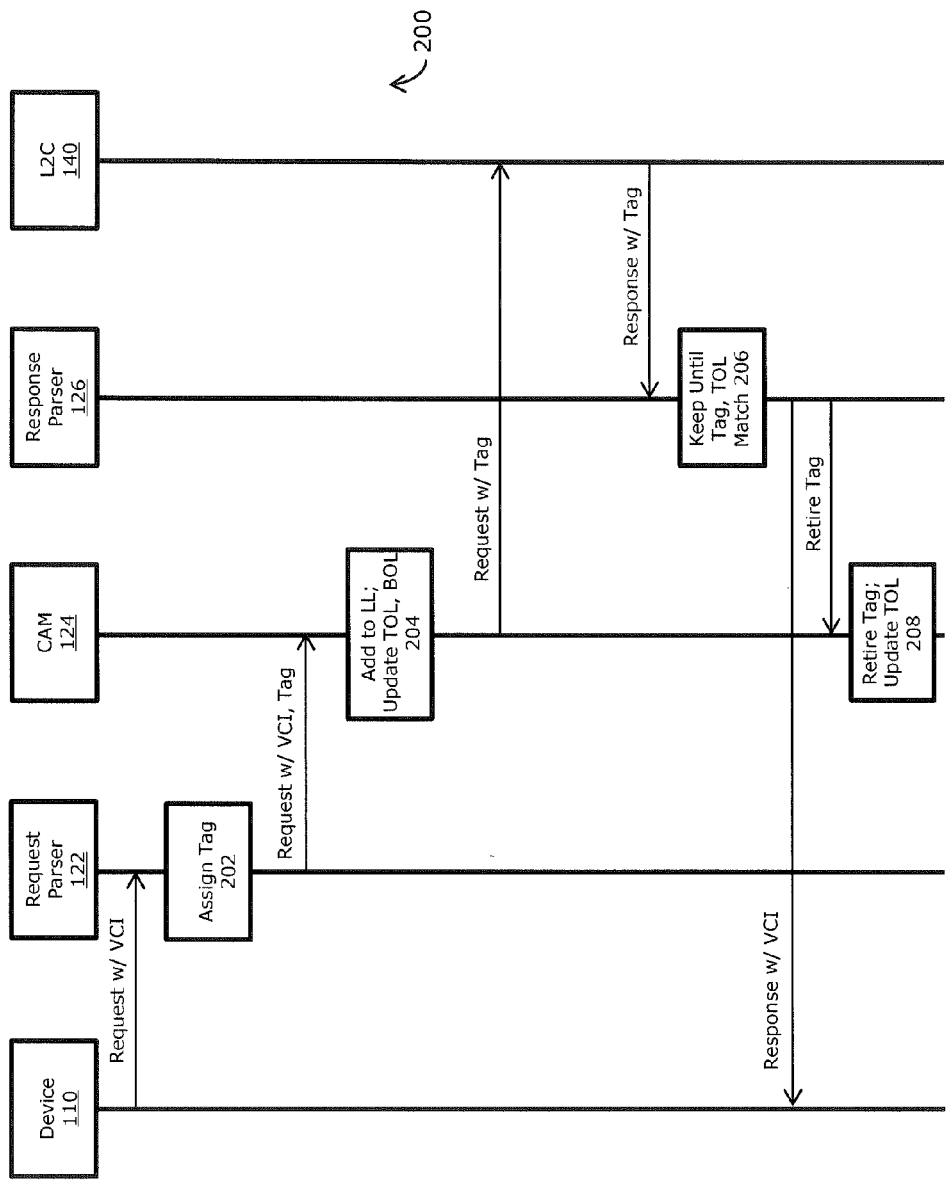
FIG. 2 is a diagram illustrating a process for managing memory access, according to at least one example embodiment.

FIG. 2 is a diagram illustrating a process 200 for managing memory access, according to at least one example embodiment. When a device 110 sends a request to the bridge unit 120, the request parser 122 receives the request with its VCI and assigns a unique tag to the request from the list of available tags 128 (202). The number of assignable tags may be limited to a manageable number of in-flight requests, e.g., 48, rather than keeping track of the $2^{12}$ possible values of the VCIs as noted above. Each tag is unique and assigned when the request arrives and retired when a response is sent to the device that generated the request. A request is considered in-flight until retired.

The request with the VCI and tag is forwarded to the CAM 124. The CAM 124 builds and maintains a linked list in the table structure 300 for each VCI that has active requests pending to the L2C 140. For each linked list the CAM 124 keeps state of which tag is at the top of the list and which tag is at the bottom of the list. A list entry contains the request and a pointer to the next entry in the list. Upon receipt of a request with VCI and tag, the CAM 124 adds the tag to the corresponding linked list for that VCI and updates the top of lists state and the bottom of lists state (204). The request with its tag is sent to the L2C 140.

Figure 3:
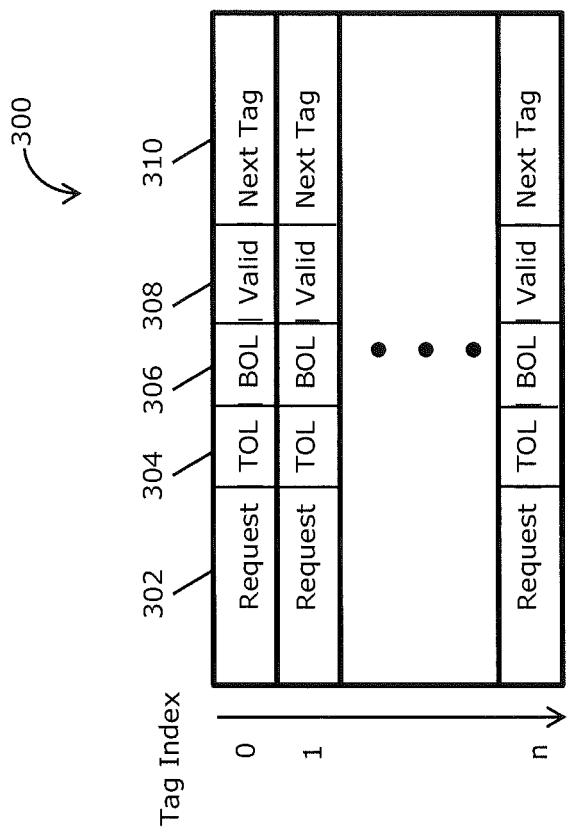
FIG. 3 illustrates an example indexed linked-list structure, according to at least one example embodiment.

FIG. 3 illustrates an example linked-list table structure 300 that is indexed by tag number. The table structure 300 includes, among other possible fields, fields for Request 302, Top of List state 304, Bottom of list state 306, Valid 308, and Next Tag 310. For a request with VCI and tag sent to the CAM 124, the CAM stores the request with its VCI in the Request field 302 indexed by its tag number. Along with the request, for each entry a status bit is set or cleared in the Top of List state and Bottom of List state fields 304, 306 to indicate if the tag is at the top of the list and/or the bottom of the list per VCI. The Next Tag field 310 stores the next tag in the particular linked list per VCI.

The CAM 124 compares the VCI of the request to all entries that have their Valid bit set. If no match is found, the CAM enters the request into the table structure 300 at the index equal to the corresponding tag for the request as follows:
  forwarded request;
  TOL==1;
  BOL==1;
  Valid==1;
  Next Tag==forwarded tag.

If a match is found, the CAM 124 enters the request into the table structure 300 at the index equal to the corresponding tag for the request as follows:
  forwarded request;
  TOL==0;
  BOL==1;
  Valid==1;
  Next Tag==forwarded tag;
    At the tag index for which the CAM found a match with the BOL bit set, the CAM sets the Next Tag field of the matching entry equal to the tag value of the forwarded request.

When the CAM enters an entry into the table structure 300 it creates a linked list of VCIs. Each unique VCI in the table structure 300 has corresponding TOL, BOL, and Valid entries that are true. When there is only one entry in the structure containing a unique VCI there is only one entry with both the TOL and BOL values set. When there are 'y' entries for a VCI in the table, there is one TOL set (corresponding to the oldest received request that has not been retired), one BOL set (corresponding to the last received request), 'y' Valid bits set (one for each of the 'y' requests received). The Next Tag entry of the oldest request received points to the 2nd oldest request received. The Next Tag entry of the 2nd oldest request points to the 3rd oldest request received (this will continue for the Next Tag field until the 'y−1' entry points to the 'y' entry).

Figure 4:
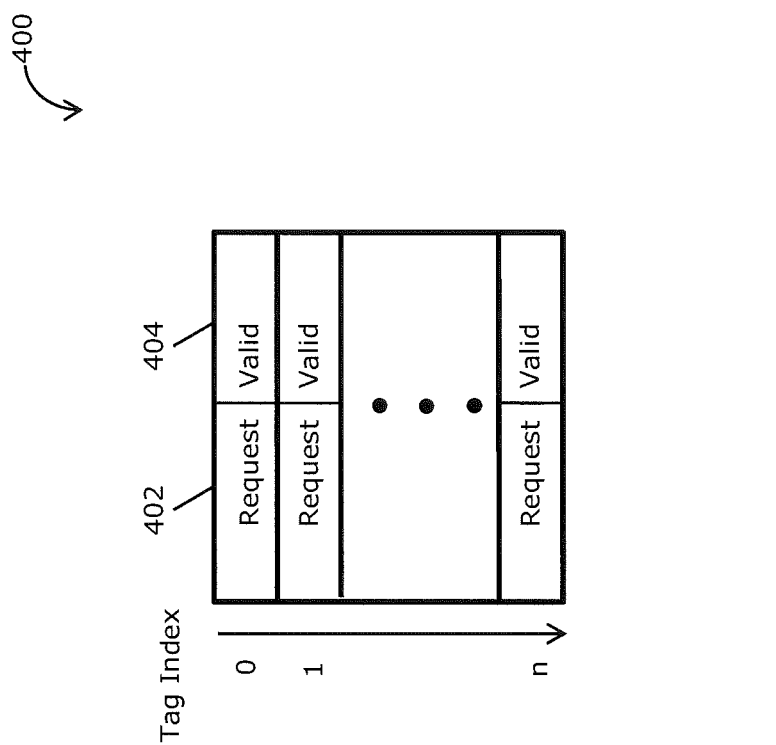
FIG. 4 illustrates an example indexed response structure, according to at least one example embodiment.

When the L2C 140 sends a response to the request it arrives at the response parser 126. The response sent from the L2C contains the tag that belongs to the response. The response parser keeps track of all responses that were received in the response table 400, an example of which is shown in FIG. 4. The response table 400 includes a Response field 402 and a Valid field 404 and is indexed by the tag number returned with the response. By comparing the tags of the received responses to the top of lists state (sent to the response parser 126 from the CAM 124), the response parser 126 can determine which response(s) can be sent to the appropriate device 110. When there is a match between received response tags and the top of lists state (corresponding to the Valid bit 404 being true and the TOL 304 of the linked-list table 300 being true for the associated tag), the response parser 126 sends the response to the device (206).

When the response is sent, the response parser 126 informs the CAM 124 that it can now retire the tag to be used for a new request. The response parser 126 clears the Valid bit 404 associated with that tag. When the CAM 124 is informed by the response parser 126 that the tag can be retired, it looks at the list entry of the tag. The CAM clears the TOL 304 and Valid 308 bits for the retired tag. The CAM also looks to see if the Valid bit 308 is set for the table entry pointed to by the Next Tag entry of the tag being retired. If the Valid bit is not set, then the CAM concludes the operation. If there is a valid request being pointed at by the next-pointer in the list entry, it updates that entry to be the top of the list (208).

While this invention has been particularly shown and described with references to example embodiments thereof, it will be understood by those skilled in the art that various changes in form and details may be made therein without departing from the scope of the invention encompassed by the appended claims.

What is claimed is:

1. A method comprising:
  receiving requests for access to a memory from one or more devices, each particular request associated with one of a plurality of virtual channels;
  for each one of the plurality of virtual channels, maintaining a corresponding linked list;
  for each particular request received, assigning a tag and adding the assigned tag to the linked list corresponding to the virtual channel associated with the particular request received;
  transmitting each request received with the assigned tag to the memory;
  receiving responses to the requests from the memory, each response having an associated tag; and
  transmitting the responses received to the one or more devices including comparing the tags of the responses received with a top of lists state indicating which tags are at the top of the corresponding linked lists and transmitting those responses received for which the comparison indicates a match.

2. The method of claim 1 wherein each request received includes a virtual channel identifier and wherein adding the assigned tag to the linked list corresponding to the virtual channel associated with the particular request received includes accessing a content addressable memory (CAM) with the virtual channel identifier of the request received to determine which linked list to add the tag.

3. The method of claim 1 further comprising, upon transmitting those responses received for which the comparison indicates a match, retiring the tags associated with those responses.

4. The method of claim 1 further comprising updating the top of lists state to replace the tags corresponding to responses transmitted with tags corresponding to the next entry in the corresponding linked lists.

5. The method of claim 1 wherein requests received are transmitted to the memory in order of receipt.

6. Apparatus comprising:
- a request parser configured to receive requests for access to a memory from one or more devices, each particular request associated with one of a plurality of virtual channels, and to assign a tag to each request received;
- a content addressable memory configured to maintain a corresponding linked list for each one of the plurality of virtual channels, to add each tag assigned to the linked list corresponding to the virtual channel associated with the particular request received and to transmit each request received with the assigned tag to the memory; and
- a response parser configured to receive responses to the requests from the memory, each response having an associated tag and to transmit the responses received to the one or more devices including comparing the tags of the responses received with a top of lists state indicating which tags are at the top of the corresponding linked lists and transmitting those responses received for which the comparison indicates a match.

7. The apparatus of claim 6 wherein each request received includes a virtual channel identifier and wherein adding the assigned tag to the linked list corresponding to the virtual channel associated with the particular request received includes accessing the linked list with the virtual channel identifier of the request received to determine which linked list to add the tag.

8. The apparatus of claim 6 wherein the content addressable memory is further configured to update the top of lists state to replace the tags corresponding to responses transmitted with tags corresponding to the next entry in the corresponding linked lists.

9. The apparatus of claim 6 wherein requests received are transmitted to the memory in order of receipt.

* * * * *